(12) United States Patent
Takeshima (10) Patent No.: US 10,845,442 B2
(45) Date of Patent: Nov. 24, 2020

(54) MAGNETIC RESONANCE IMAGING APPARATUS, PROCESSING APPARATUS AND MEDICAL IMAGE PROCESSING METHOD

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 34 days.

(21) Appl. No.: 16/394,011

(22) Filed: Apr. 25, 2019

(65) Prior Publication Data

US 2019/0361079 A1 Nov. 28, 2019

(30) Foreign Application Priority Data

May 28, 2018 (JP) ................................. 2018-101672

(51) Int. Cl.
*G01R 33/48* (2006.01)
*G01R 33/561* (2006.01)

(52) U.S. Cl.
CPC ...... *G01R 33/4818* (2013.01); *G01R 33/5611* (2013.01)

(58) Field of Classification Search
CPC .......... G01R 33/4818; G01R 33/5611; G01R 33/56325; G01R 33/5619; G01R 33/4824
See application file for complete search history.

(56) References Cited

U.S. PATENT DOCUMENTS

| 5,329,925 | A | * | 7/1994 | NessAiver | ........... | A61B 5/0263 |
| | | | | | | 324/306 |
| 2005/0174113 | A1 | | 8/2005 | Tsao et al. | | |
| 2005/0272997 | A1 | * | 12/2005 | Grist | .................. | G01R 33/5673 |
| | | | | | | 600/410 |
| 2009/0262996 | A1 | * | 10/2009 | Samsonov | ......... | G01R 33/5611 |
| | | | | | | 382/130 |

(Continued)

FOREIGN PATENT DOCUMENTS

| JP | 2017-086825 | 5/2017 |
| JP | 2019-96139 A | 6/2019 |

OTHER PUBLICATIONS

L. Feng, et al., "Golden-Angle Radial Sparse Parallel MRI: Combination of Compressed Sensing, Parallel Imaging, and Golden-Angle Radical Sampling for Fast and Flexible Dynamic Volumetric MRI", Magnetic Resonance in Medicine, vol. 72, 2014, pp. 707-717.

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry configured to generate a plurality of reference partial k-space data items based on the filling positions and reference k-space data, generate a plurality of difference k-space data items by taking differences between the partial k-space data items and the reference k-space data items to each of the frames, generate a plurality of difference images by applying the reconstruction processing respectively to the difference k-space data items, and generate a plurality of composite images by combining the reference image with each of the difference images.

15 Claims, 6 Drawing Sheets

(56) References Cited

U.S. PATENT DOCUMENTS

2010/0152568 A1* 6/2010 Kokubun ............... A61B 5/721
                                                    600/410
2017/0139028 A1   5/2017 Saito et al.

* cited by examiner

MAGNETIC RESONANCE IMAGING APPARATUS, PROCESSING APPARATUS AND MEDICAL IMAGE PROCESSING METHOD

CROSS-REFERENCE TO RELATED APPLICATIONS

This application is based upon and claims the benefit of priority from Japanese Patent Application No. 2018-101672, filed May 28, 2018, the entire contents of which are incorporated herein by reference.

FIELD

Embodiments described herein relate generally to a magnetic resonance imaging apparatus, a processing apparatus, and a medical image processing method.

BACKGROUND

In magnetic resonance imaging (MRI) apparatuses of recent years, a technique for acquiring time-series images, such as dynamic imaging, is known.

Specifically, for example, there is a known method which uses NFFT (Nonequispaced Fast Fourier Transform) and reconstructs a dynamic picture image from k-space data collected by a radial scan. In the method, data in a peripheral region of k-space is collected sparsely (that is, so as to be lower than a Nyquist sampling criterion), so that the amount of the collected k-space data can be reduced to shorten the imaging period. Within the collected k-space data, the data corresponding to a peripheral region of the k-space is complemented by regularization, or the like, during reconstruction. However, in that method, since the complementing accuracy in the peripheral region of the k-space is low, the profile line in the obtained image may blur.

Besides, for example, in reconstruction using k-t BLAST (k-t space Broad-use Linear Acquisition Speed-up Technique) and k-t SENSE(k-t SENSitivity Encoding), there is another known method in which k-space average data is subtracted from under-sampled k-space data to shorten the imaging period. This method utilizes a characteristic of collecting data a plurality of times in the same position of an image. Therefore, it is difficult to apply the method to a radial scan that utilizes, for example, a golden angle method, in which data is not collected a plurality of times in the same position in the k-space.

In either method, the imaging period can be shortened within a restricted processing time; however, there is a possibility that the quality of the image may be low. In other words, according to the conventional methods, it is difficult to obtain a high-quality magnetic resonance image within the restricted processing time.

DETAILED DESCRIPTION

In general, according to one embodiment, a magnetic resonance imaging apparatus includes processing circuitry. The processing circuitry configured to generate reference k-space data by applying inverse transform of reconstruction processing to a reference image, generate a plurality of reference partial k-space data items so as to respectively correspond to a plurality of partial k-space data items relating to a plurality of frames at different filling positions in a k-space and arranged in time sequence, based on the filling positions and the reference k-space data, generate a plurality of difference k-space data items by taking differences between the partial k-space data items and the reference k-space data items to each of the frames, generate a plurality of difference images by applying the reconstruction processing respectively to the difference k-space data items, and generate a plurality of composite images by combining the reference image with each of the difference images.

Hereinafter, a magnetic resonance imaging apparatus, a processing apparatus, and a medical image processing method according to an embodiment will be explained in detail with reference to the accompanying drawings.

Figure 1:
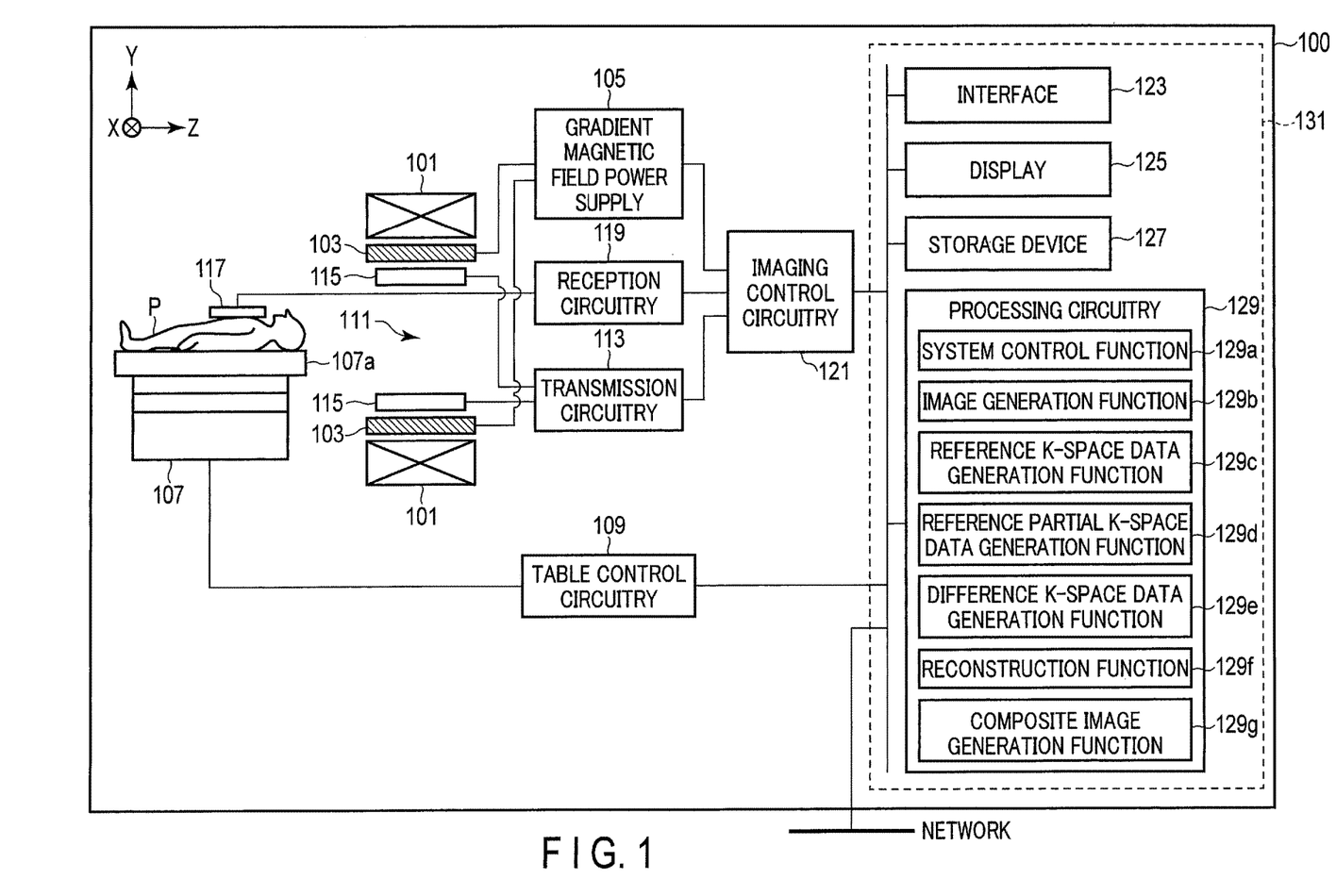
FIG. 1 is a diagram illustrating a configuration of an MRI apparatus according to an embodiment.

FIG. 1 is a diagram showing the configuration of an MRI apparatus according to the present embodiment. As shown in FIG. 1, for example, an MRI apparatus 100 of the embodiment includes a static field magnet 101, a gradient coil 103, a gradient magnetic field power supply 105, a table 107, table control circuitry 109, transmission circuitry 113, a transmission coil 115, a reception coil 117, reception circuitry 119, imaging control circuitry 121, an interface 123, a display 125, a storage device 127, and processing circuitry 129. The MRI apparatus 100 may include a hollow cylindrical shim coil provided between the static field magnet 101 and the gradient coil 103.

The static field magnet 101 is, for example, a hollow and approximately-cylindrical magnet. The static field magnet 101 generates a homogeneous static magnetic field in a bore 111, which is an inner space into which a subject P is inserted. For example, a superconductive magnet, etc. may be used for the static field magnet 101.

The gradient coil 103 is, for example, a hollow and approximately-cylindrical magnet provided inside the static magnetic field magnet 101. The gradient coil 103 is a combination of three coils corresponding to X, Y, Z-axes orthogonal to one another. The Z-axis direction is the same as the direction of the static magnetic field. In addition, the Y-axis direction is a vertical direction, and the X-axis direction is a direction perpendicular to each of the Z-axis and the Y-axis. The gradient coil 103 generates a gradient magnetic field to be superimposed onto the static magnetic field. Specifically, the three coils in the gradient coil 103 are individually supplied with a current from the gradient magnetic field power supply 105, and generate gradient magnetic fields whose magnetic field intensity changes along the respective X, Y, and Z-axes.

The gradient magnetic fields along each of the X-, Y-, and Z-axes generated by the gradient coil 103 respectively form, for example, a frequency-encoding gradient magnetic field (readout gradient magnetic field), a phase-encoding gradient magnetic field, and a slice-selection gradient magnetic field. The frequency-encoding gradient magnetic field is used to change the frequency of an MR signal in accordance with the spatial position. The phase-encoding gradient magnetic field is used to change the phase of a magnetic resonance (hereinafter referred to as "MR") signal in accordance with the spatial position. The slice-selection gradient magnetic field is used to determine an imaging slice.

The gradient magnetic field power supply 105 is a power supply device that supplies a current to the gradient coil 103 under the control of the imaging control circuitry 121.

The table 107 is an apparatus having a table top 107a on which the subject P is placed. The table 107 inserts the table top 107a, on which the subject P is placed, into the bore 111 under the control of the table control circuitry 109. The table 107 is installed in an examination room in which the present MRI apparatus 100 is installed in such a manner that, for example, its longitudinal direction is parallel to the central axis of the static field magnet 101.

The table control circuitry 109 is circuitry that controls the table 107. The table control circuitry 109 drives the table 107 in response to operator's instructions via the interface 123 to move the table top 107a in the longitudinal directions and vertical directions, and if necessary, horizontal directions.

The transmission circuitry 113 supplies, under the control of the imaging control circuitry 121, a high-frequency pulse corresponding to a Larmor frequency, or the like, to the transmission coil 115.

The transmission coil 115 is an RF (radio frequency) coil provided inside the gradient coil 103. The transmission coil 115 receives a high-frequency pulse from the transmission circuitry 113, and generates a transmission RF wave (RF pulse) which corresponds to a high-frequency magnetic field. The transmission coil may be, for example, a whole body (WB) coil. The WB coil may be used as a transmission/reception coil.

The reception coil 117 is an RF coil provided inside the gradient coil 103. The reception coil 117 receives an MR signal that the radio frequency magnetic field causes the subject P to emit. The reception coil 117 outputs the received MR signal to the reception circuitry 119. The reception coil 117 is, for example, a coil array having one or more coil elements, and typically having a plurality of coil elements. FIG. 1 shows the transmission coil 115 and the reception coil 117 as separate RF coils; however, the transmission coil 115 and the reception coil 117 may be embodied as an integrated transmission/reception coil. The transmission/reception coil is, for example, a local transmission/reception RF coil such as a head coil.

The reception circuitry 119 generates, under the control of the imaging control circuitry 121, a digital MR signal, which is digitized complex number data, based on the MR signal output from the reception coil 117. Specifically, the reception circuitry 119 performs various types of signal processing on the MR signal output from the reception coil 117, and then performs analog-to-digital (A/D) conversion on the data subjected to the various types of signal processing. The reception circuitry 119 samples the A/D converted data to generate the digital MR signal (hereinafter referred to as "MR data"). The reception circuitry 119 outputs the generated MR data to the imaging control circuitry 121.

The imaging control circuitry 121 controls the gradient magnetic field power supply 105, the transmission circuitry 113, the reception circuitry 119, etc. in accordance with an imaging protocol output from the processing circuitry 129, and performs imaging on the subject P. The imaging protocol includes various pulse sequences corresponding to the examination. The imaging protocol presets the magnitude of the current supplied from the gradient magnetic field power supply 105 to the gradient coil 103; timing of the supply of the current from the gradient magnetic field power supply 105 to the gradient coil 103; the magnitude of the high-frequency pulse supplied from the transmission circuitry 113 to the transmission coil 115; timing of the supply of the high frequency pulse from the transmission circuitry 113 to the transmitter coil 115; and timing of reception of the MR signal at the reception coil 117, etc. The imaging control circuitry 121 is an example of an acquisition unit.

For example, if a radial scan is performed in accordance with a pulse sequence in which an MR signal is acquired corresponding to each of a plurality of collecting lines along a plurality of radial directions in the k-space, the imaging control circuitry 121 controls the gradient magnetic field power supply 105 so as to simultaneously generate a phase-encoding gradient magnetic field and a frequency-encoding gradient magnetic field as a readout gradient magnetic field. In addition, the imaging control circuitry 121 controls the gradient magnetic field power supply 105 in such a manner that an intensity of the phase-encoding gradient magnetic field and an intensity of the frequency-encoding gradient magnetic field are changed every time a high-frequency pulse is applied to the transmission coil 115. Upon generation of a readout gradient magnetic field, the imaging control circuitry 121 controls the reception circuitry 119 to receive MR signals. The imaging control circuitry 121 outputs MR data output from the reception circuitry 119, along with an intensity and a radial direction (a position arranged in k-space) of the readout gradient magnetic field, to the processing circuitry 129 and the storage device 127.

In the radial scan, a scan passing through the center of a k-space is performed, while the reading direction is rotated to cross a section passing through the center of the k-space. Through the radial scan, two dimensional data within a circle drawn on a section in the k-space can be collected. Thus, the radial scan collects data in a central region of the k-space at a high density, and data in a peripheral region of the k-space at a low density. In the radial scan, collection lines extend from the center of the k-space in radial directions like a wheel, and the segments drawn by scans in reading directions are called spokes.

Unlike the Cartesian scan, the radial scan cannot necessarily obtain a sample value (signal value) corresponding to a grid point in the k-space. Therefore, to reconstruct data collected by the radial scan, a method other than Fourier transform (or inverse discrete Fourier transform) is used. Reconstruction of the data collected by the radial scan is performed by modeling a process of generating a signal from an MR image using Nonequispaced Discrete Fourier Transform (NDFT), or Nonequispaced Fast Fourier Transform (NFFT), which is a fast version of the NDFT. Both the NDFT and the NFFT are linear transforms. If a sufficiently large number of samples are collected by the radial scan, a data reconstruction method called "gridding" may be used.

The reconstruction mentioned above can improve the quality of a reconstructed image by using parallel imaging (PI) together. The PI is a technique for reconstructing an image from data obtained by scanning part of the k-space data (partial k-space data item), utilizing a difference in sensitivity among a plurality of reception coils.

The method for generating an MR image from the partial k-space data item is used, for example, in dynamic imaging. The dynamic imaging means continuously imaging a plurality of MR images. If a change of the subject appears only in a part of the MR image, an MR image can be reconstructed from k-space data with a reduced amount of collected data (partial k-space data item) in consideration of consecutiveness in a time direction.

Compressed sensing is already known as a reconstruction technique in consideration of consecutiveness in a time direction. The compressed sensing is a technique for, in a case of applying the known linear transform to input data, estimating original input data by utilizing an assumption that most of the values of applied data are zero, even if the input data are insufficient. In one embodiment, if a linear transform relating to a difference between frames of pixel values is applied to a reconstructed image, the assumption that most of the values of pixels of the reconstructed image are zeros is introduced. "A frame" is each of the still images constructing a moving image, and corresponds to, for example, a reconstructed MR image.

The imaging control circuitry 121 specifically acquires a plurality of partial k-space data items relating to a plurality of frames in time sequence at different data arrangement positions in the k-space. The phrase "at different data arrangement positions in the k-space" means that data are collected in spokes at different positions between adjacent frames, for example, in the radial scan. "Partial k-space data" means k-space data of the arrangement positions of a reduced number of spokes, respectively corresponding to the frames. In other words, the collected amount of the partial k-space data items is less than the amount of data that can normally be collected.

The imaging control circuitry 121 may separately acquire k-space data for generating a reference image before collecting the partial k-space data items. Alternatively, the imaging control circuitry 121 may separately acquire k-space data for generating a reference image after collecting the partial k-space data items. Besides, the imaging control circuitry 121 may separately acquire k-space data for generating a reference image before or after an angiographic examination. The details of the reference image will be described later.

The number of spokes in the k-space is determined discretionarily. For example, if the total number of spokes that do not overlap is set to 600 and signals are collected from 20 spokes in each frame, a partial k-space data item of 30 frames that do not overlap among frames can be acquired. The number of spokes included in a partial k-space data item is smaller than the total number of spokes set in the k-space. The arrangement of spokes in the partial k-space data item of one frame is different from that of another, adjacent frame.

In the radial scan, only the number of spokes per frame may be determined. In this case, to prevent the spokes of adjacent frames from overlapping, spokes that pass through the point of origin in the k-space and are arranged to increase the angle in units of 55.6 degrees in the k-space may be used, or the spokes that are arranged to increase the angle in units of 111.25 degrees may be used (golden angle method).

Figure 2:
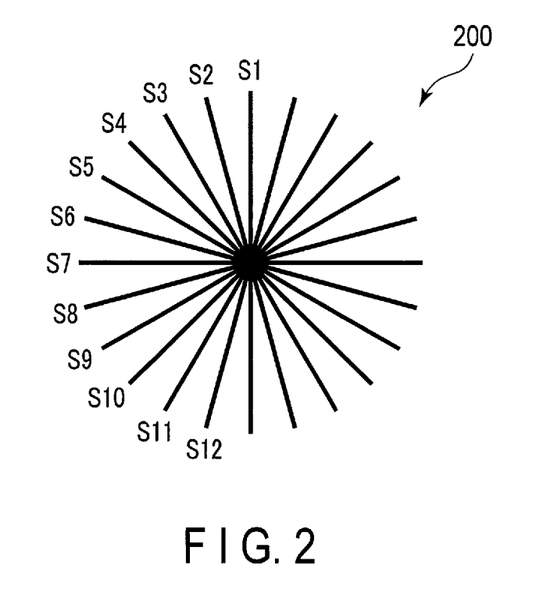
FIG. 2 is a diagram illustrating k-space data collected by a radial scan along all spokes in the embodiment.

FIG. 2 is a diagram illustrating k-space data collected by a radial scan along all spokes in an embodiment. For example, as shown in FIG. 2, k-space data 200 according to the embodiment is collected at collecting positions along the respective reading directions of spokes S1 to S12. In FIG. 2 to FIG. 7, the total number of spokes in the k-space data is 12 for simplicity of explanation, but is not limited thereto.

Figure 3:
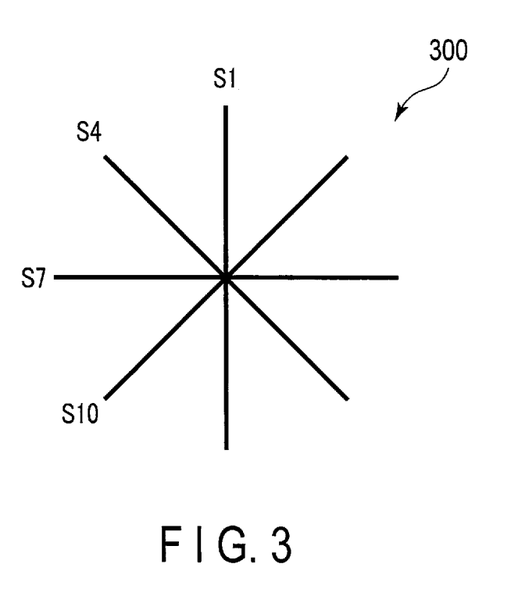
FIG. 3 is a diagram illustrating a first partial k-space data item reduced from the k-space data shown in FIG. 2.

FIG. 3 is a diagram illustrating a first partial k-space data item reduced from the k-space data shown in FIG. 2. For example, as shown in FIG. 3, in a first partial k-space data item 300, k-space data are collected at collecting positions along the respective reading directions of spokes S1, S4, S7, and S10. In other words, the first partial k-space data item 300 is k-space data constituted by the combination of the spokes S1, S4, S7, and S10.

Figure 4:
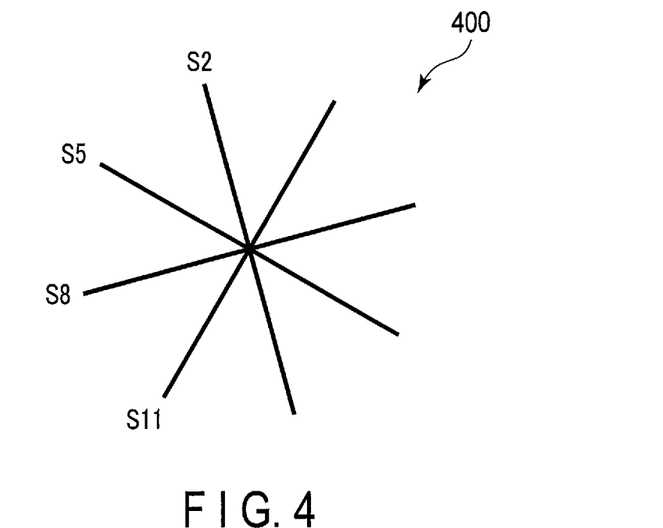
FIG. 4 is a diagram illustrating a second partial k-space data item reduced from the k-space data shown in FIG. 2.

FIG. 4 is a diagram illustrating a second partial k-space data item reduced from the k-space data shown in FIG. 2. For example, as shown in FIG. 4, in a second partial k-space data item 400, k-space data are collected at collecting positions along the respective reading directions of spokes S2, S5, S8, and S11. In other words, the second partial k-space data item 400 is k-space data constituted by the combination of the spokes S2, S5, S8, and S11. Thus, the second partial k-space data item 400 differs from the first partial k-space data item 300 in data arrangement position in the k-space.

Figure 5:
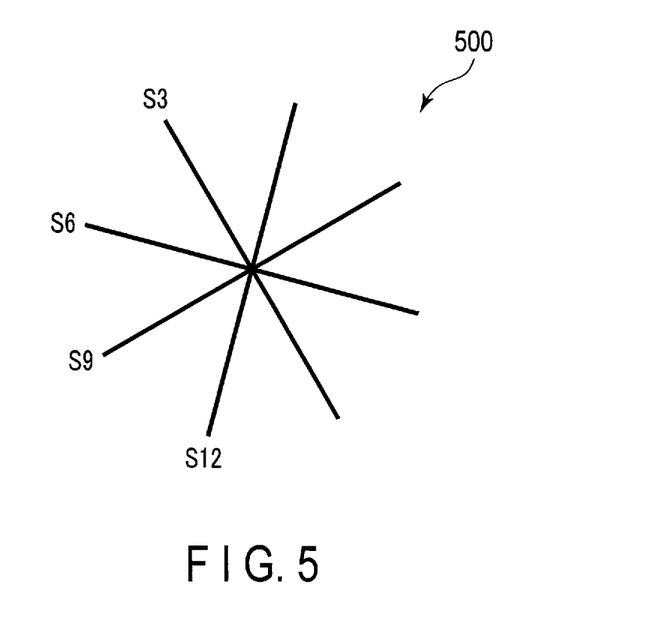
FIG. 5 is a diagram illustrating a third partial k-space data item reduced from the k-space data shown in FIG. 2.

FIG. 5 is a diagram illustrating a third partial k-space data item reduced from the k-space data shown in FIG. 2. For example, as shown in FIG. 5, in a third partial k-space data item 500, k-space data are collected at collecting positions along the respective reading directions of spokes S3, S6, S9, and S12. In other words, the third partial k-space data item 500 is k-space data constituted by the combination of the spokes S3, S6, S9, and S12. Thus, the third partial k-space data item 500 differs from the first partial k-space data item 300 and the second partial k-space data item 400 in data arrangement position in the k-space.

Figure 6:
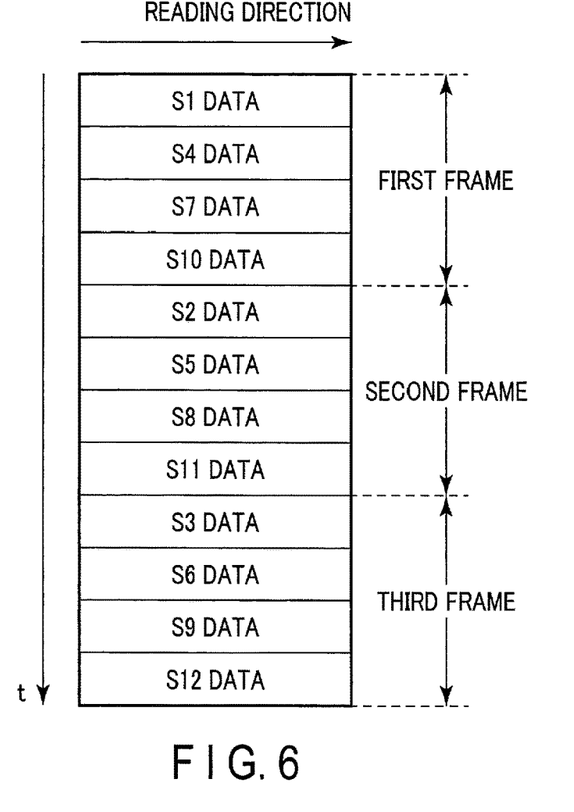
FIG. 6 is a diagram illustrating a sequence of collecting data corresponding to spokes collected by a radial scan according to the embodiment.

FIG. 6 is a diagram illustrating a sequence of collecting data corresponding to spokes collected by a radial scan according to one embodiment. In the following, data corresponding to a spoke Sn is referred to as "Sn data". For example, as shown in FIG. 6, k-space data respectively corresponding to a first frame, a second frame and a third frame are arranged in time sequence.

The k-space data for use in the first frame are collected in the order of S1 data, S4 data, S7 data, and S10 data. The k-space data for use in the second frame are collected in the order of S2 data, S5 data, S8 data, and S11 data. The k-space data for use in the third frame are collected in the order of S3 data, S6 data, S9 data, and S12 data.

The boundary between the first frame and the second frame corresponds to the boundary between S10 data and S2 data. The boundary between the second frame and the third frame corresponds to the boundary between S11 data and S3 data.

The order of collecting data within a frame is not limited to the above but may be set discretionarily. Therefore, the boundary between the adjacent frames is not restricted to the above, but corresponds to the boundary between the adjacent data in accordance with the order of collecting the data.

Figure 7:
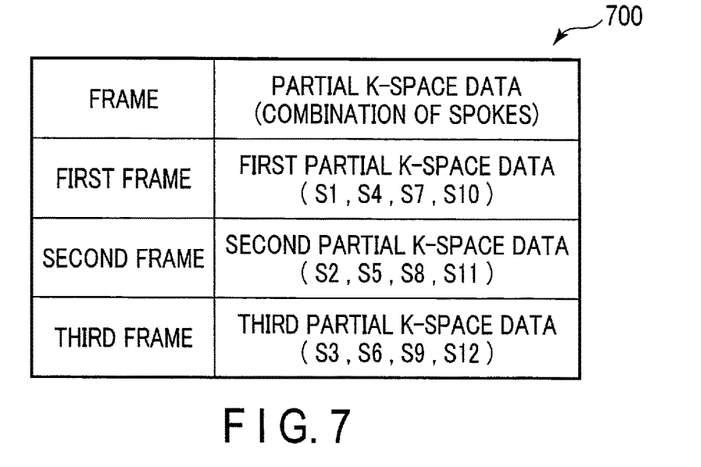
FIG. 7 is a diagram showing a correspondence table of the embodiment in which a frame and a partial k-space item are associated.

FIG. 7 is a diagram showing a correspondence table of an embodiment in which a frame and a partial k-space item are associated. For example, in a correspondence table 700, as shown in FIG. 7, the first frame is associated with a first partial k-space data item, the second frame is associated with a second partial k-space data item, and the third frame is associated with a third partial k-space data item. A look-up table (LUT) may be used as the correspondence table 700.

The interface 123 includes a circuit that receives various instructions and information inputs from the operator. The interface 123 includes a circuit relating to, for example, a pointing device such as a mouse, or an input device such as a keyboard. The circuit included in the interface 123 is not limited to a circuit relating to a physical operational component, such as a mouse or a keyboard. For example, the interface 123 may include an electrical signal processing circuit, which receives an electrical signal corresponding to an input operation from an external input device provided separately from the present MRI apparatus 100 and outputs the received electrical signal to various circuits.

The display 125 displays, for example, various MR images generated by an image generation function 129b, and various types of information on imaging and image processing, under the control of a system control function 129a in the processing circuitry 129. The display 125 is, for example, a CRT display, a liquid crystal display, an organic EL display, an LED display, a plasma display, any other display or a monitor known in the relevant technical field.

The storage device 127 stores MR data filled in the k-space by the image generation function 129b, and image data generated by the image generation function 129b, etc. The storage device 127 stores, for example, various imaging protocols, and an imaging condition including a plurality of imaging parameters defining each imaging protocol. The storage device 127 stores programs corresponding to various functions performed by the processing circuitry 129.

The storage device 127 may also store a combination of a plurality of spokes respectively corresponding to the frames. Specifically, the storage device 127 stores a correspondence table in which a frame and partial k-space data are associated.

The storage device 127 is, for example, a semiconductor memory element, such as a RAM (Random Access Memory) and a flash memory, a hard disk drive, a solid state drive, an optical disk, etc. The storage device 127 may also be a drive, etc. configured to read and write various types of information with respect to a portable storage medium such as a CD-ROM drive, a DVD drive, or a flash memory, etc.

The processing circuitry 129 includes, as hardware resources, a processor and a memory such as a read-only memory (ROM) and a RAM, which are not shown, and controls the MRI apparatus 100. The processing circuitry 129 has the system control function 129a, the image generation function 129b, a reference k-space data generation function 129c, a reference partial k-space data generation function 129d, a difference k-space data generation function 129e, a reconstruction function 129f, and a composite image generation function 129g. The storage device 127 stores, in a form of a computer-executable program, various types of functions which are executed by the system control function 129a, the image generation function 129b, the reference k-space data generation function 129c, the reference partial k-space data generation function 129d, the difference k-space data generation function 129e, the reconstruction function 129f, and the composite image generation function 129g. The processing circuitry 129 is a processor that reads programs corresponding to the various functions from the storage device 127 and executes them to realize the functions corresponding to the programs. In other words, the processing circuitry 129 that has read the programs possesses, for example, the functions of the processing circuitry 129 shown in FIG. 1.

FIG. 1 illustrates the case where the various functions are realized in the single processing circuitry 129; however, the functions may be realized by a combination of a plurality of independent processors, which execute the programs. In other words, the above-described functions may be configured as programs, and executed by a single processing circuit; alternatively, a specific function may be implemented in a dedicated independent program-execution circuit.

The term "processor" used in the above description means, for example, a central processing unit (CPU), a graphics processing unit (GPU), or circuitry such as an application specific integrated circuit (ASIC), a programmable logic device (e.g., a simple programmable logic device (SPLD), a complex programmable logic device (CPLD)), and a field programmable gate array (FPGA).

The processor realizes various functions by reading and executing programs stored in the storage device 127. The programs may be directly integrated into a circuit of the processor, instead of being stored in the storage device 127. In this case, the processor realizes functions by reading and executing programs which are integrated in the circuit. The table control circuitry 109, the transmission circuitry 113, the reception circuitry 119, and the imaging control circuitry 121, etc. are also similarly configured as electronic circuitry such as the processor described above. The system control function 129a, the image generation function 129b, the reference k-space data generation function 129c, the reference partial k-space data generation function 129d, the difference k-space data generation function 129e, the reconstruction function 129f, and the composite image generation function 129g of the processing circuitry 129 are examples of a system control unit, an image generation unit, an inverse transform unit, a generation unit, a difference unit, a reconstruction unit, and a composite unit, respectively.

The processing circuitry 129 controls the MRI apparatus 100 through the system control function 129a. Specifically, the processing circuitry 129 reads the system control program stored in the storage device 127, deploys it on the memory, and controls each circuitry of the MRI apparatus 100 in accordance with the deployed system control program. For example, the processing circuitry 129 reads an imaging protocol from the storage device 127 through the system control function 129a, based on an imaging condition input by the operator via the interface 123. The processing circuitry 129 may generate the imaging protocol based on the imaging condition. The processing circuitry 129 transmits the imaging protocol to the imaging control circuitry 121, and controls imaging on the subject P.

The processing circuitry 129 fills the k-space with MR data through the image generation function 129b. The processing circuitry 129 performs the Fourier transform on the MR data filled in the k-space to generate an MR image. The MR image corresponds to, for example, a morphological image relating to the subject P. The processing circuitry 129 outputs the MR image to the display 125 or the storage device 127.

The processing circuitry 129 applies inverse transform of the reconstruction processing for a reference image through the reference k-space data generation function 129c, thereby generating reference k-space data. The inverse transform of the reconstruction processing corresponds to, for example, generation of k-space data from a reference image by simulation. In the case of simulating k-space data obtained by a radial scan, k-space data is generated by, for example, applying the NDFT or the NFFT to the reference image. The reference image is generated by the reconstruction function 129f, but may also be generated by the image generation function 129b.

The reference image is an image relating to, for example, k-space data obtained by integrating all partial k-space data items corresponding to a plurality of frames. The plurality of frames are all frames that generate a moving picture from the preset number of frames. All frames correspond to k-space data items acquired from, for example, a plurality of spokes which are different from frame to frame.

The reference image may be an image relating to k-space data obtained by integrating two or more data items of a plurality of partial k-space data items corresponding to the frames. The reference image may be an image relating to k-space data collected before or after collection of a plurality of partial k-space data items corresponding to the frames. The reference image may be an image relating to k-space data collected before or after an angiographic examination.

The processing circuitry 129 generates, using the reference partial k-space data generation function 129d, a plurality of reference partial k-space data items, based on filling positions and reference k-space data, so as to respectively correspond to a plurality of partial k-space data items relating to a plurality of frames whose data filling position differs in the k-space and which are arranged in time sequence. Specifically, the processing circuitry 129 generates a plurality of reference partial k-space data items by extracting k-space traces respectively corresponding to the filling positions from the reference k-space data.

The processing circuitry 129 generates, using the difference k-space data generation function 129e, a plurality of difference k-space data items by taking a difference between partial k-space data items and reference k-space data items to each of the frames.

The processing circuitry 129 generates, using the reconstruction function 129f, a plurality of difference images by applying the reconstruction processing to each of difference k-space data items. The processing circuitry 129 may generate, using the reconstruction function 129f, a plurality of difference images by applying the reconstruction processing which introduced a correlation between frames to the difference k-space data items. The correlation between frames corresponds to, for example, compressed sensing in consideration of consecutiveness in a time direction.

The processing circuitry 129 may generate, using the reconstruction function 129f, a reference image by applying reconstruction processing to the k-space data. Specifically, the processing circuitry 129 generates a reference image by applying the reconstruction processing to the k-space data obtained by integrating all of the partial k-space data items. When applying the reconstruction processing to k-space data obtained by a radial scan, a reference image is generated by, for example, using the NDFT or the NFFT and the compressed sensing for the reference image.

The processing circuitry 129 may generate, using the reconstruction function 129f, a reference image by applying reconstruction processing to the k-space data obtained by integrating N (N=2) or more data items of the partial k-space data items. The value of N is set to ensure a certain level of image quality of a reference image after reconstruction processing. For example, the processing circuitry 129 may set the value of N at the timing when the nozzle level of a reference image becomes lower than the threshold value.

The processing circuitry 129 may generate, using the reconstruction function 129f, a reference image by applying reconstruction processing to the k-space data collected before collection of the partial k-space data items, or to the k-space data collected after collection of the partial k-space data items.

The processing circuitry 129 may generate, using the reconstruction function 129f, a reference image by applying reconstruction processing to the k-space data collected before or after the angiographic examination. For example, a reference image relating to k-space data collected before the angiographic examination is used to generate frames of the former half of the time sequence in the angiographic examination. A reference image relating to k-space data collected after the angiographic examination is used to generate frames of the latter half of the time sequence in the angiographic examination.

The processing circuitry 129 generates, using the composite image generation function 129g, a plurality of composite images by combining the reference image with each of the difference images. Specifically, the processing circuitry 129 generates a plurality of composite images through simple addition of the reference image to each of the difference images. The simple addition corresponds to, for example, the adding together of pixel values of a plurality of images at the same pixel position.

Figure 8:
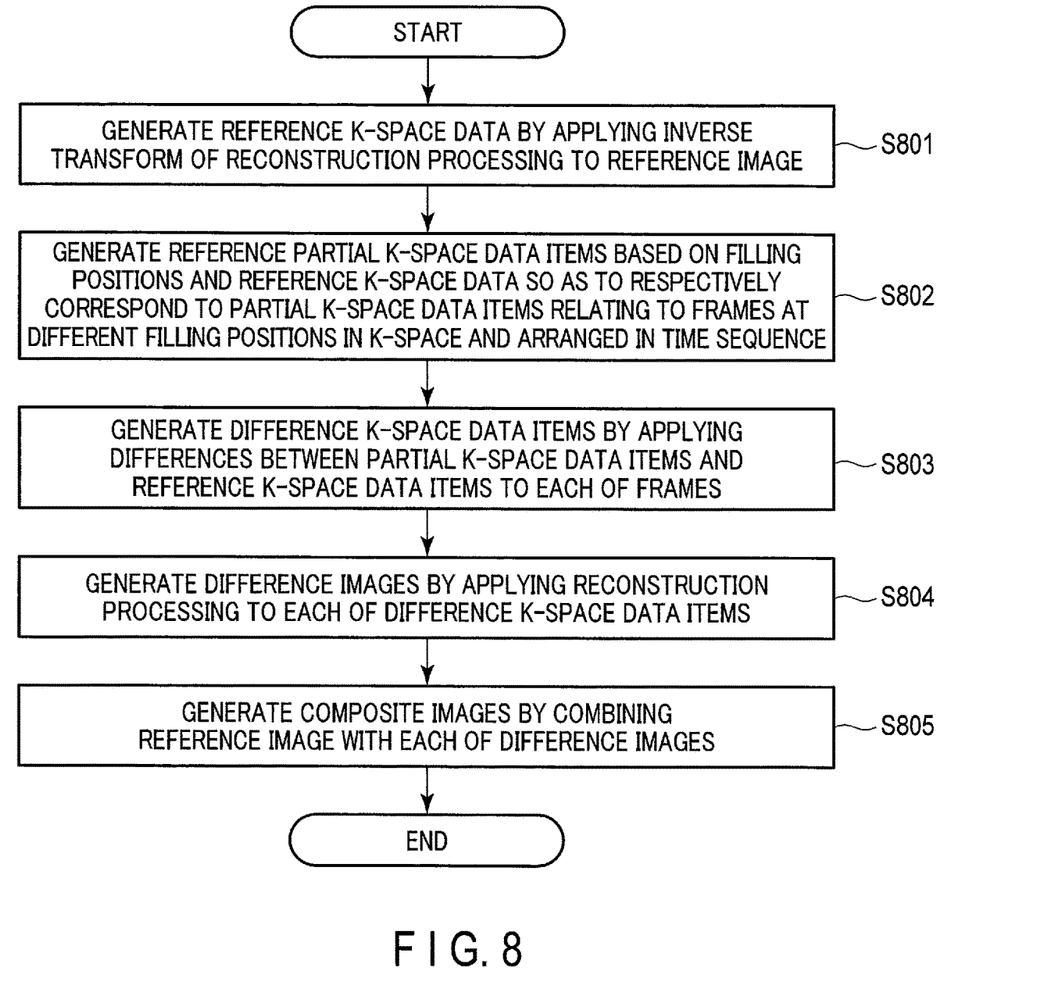
FIG. 8 is a flowchart showing a process executed by processing circuitry of the embodiment.

FIG. 8 is a flowchart showing a process executed by processing circuitry of the embodiment. The process shown in FIG. 8 is started by executing, by the processing circuitry 129, a program concerning difference reconstruction processing, at the timing when the user, or the like, inputs an instruction to start the reconstruction processing.

The difference reconstruction processing is processing for generating a difference image by applying reconstruction processing to difference k-space data, obtained by subtracting reference k-space data based on the reference image from the acquired time-series k-space data, and generating a reconstruction image by adding the reference image to the difference image. Owing to the difference reconstruction processing, a higher quality of the reconstruction image can be expected by reconstructing the difference k-space data as compared to the case of directly reconstructing the time-series k-space data.

In the following, explanations will be given on the assumption that partial k-space data items respectively corresponding to a plurality of frames have been acquired in advance by the imaging control circuitry 121.

(Step S801)

The processing circuitry 129 generates, using the reference k-space data generation function 129c, reference k-space data by applying inverse transform of the reconstruction processing to the reference image.

(Step S802)

The processing circuitry 129 generates, using the reference partial k-space data generation function 129d, a plurality of reference partial k-space data items based on the filling positions and the reference k-space data, so as to respectively correspond to a plurality of partial k-space data items relating to a plurality of frames at different filling positions in the k-space and arranged in time sequence.

(Step S803)

The processing circuitry 129 generates, using the difference k-space data generation function 129e, a plurality of difference k-space data items by taking differences between the partial k-space data items and the reference k-space data items to each of the frames.

(Step S804)

The processing circuitry 129 generates, using the reconstruction function 129f, a plurality of difference images by applying reconstruction processing to each of the difference k-space data items.

(Step S805)

The processing circuitry 129 generates, using the composite image generation function 129g, a plurality of composite images by combining the reference image with each of the difference images.

Figure 9:
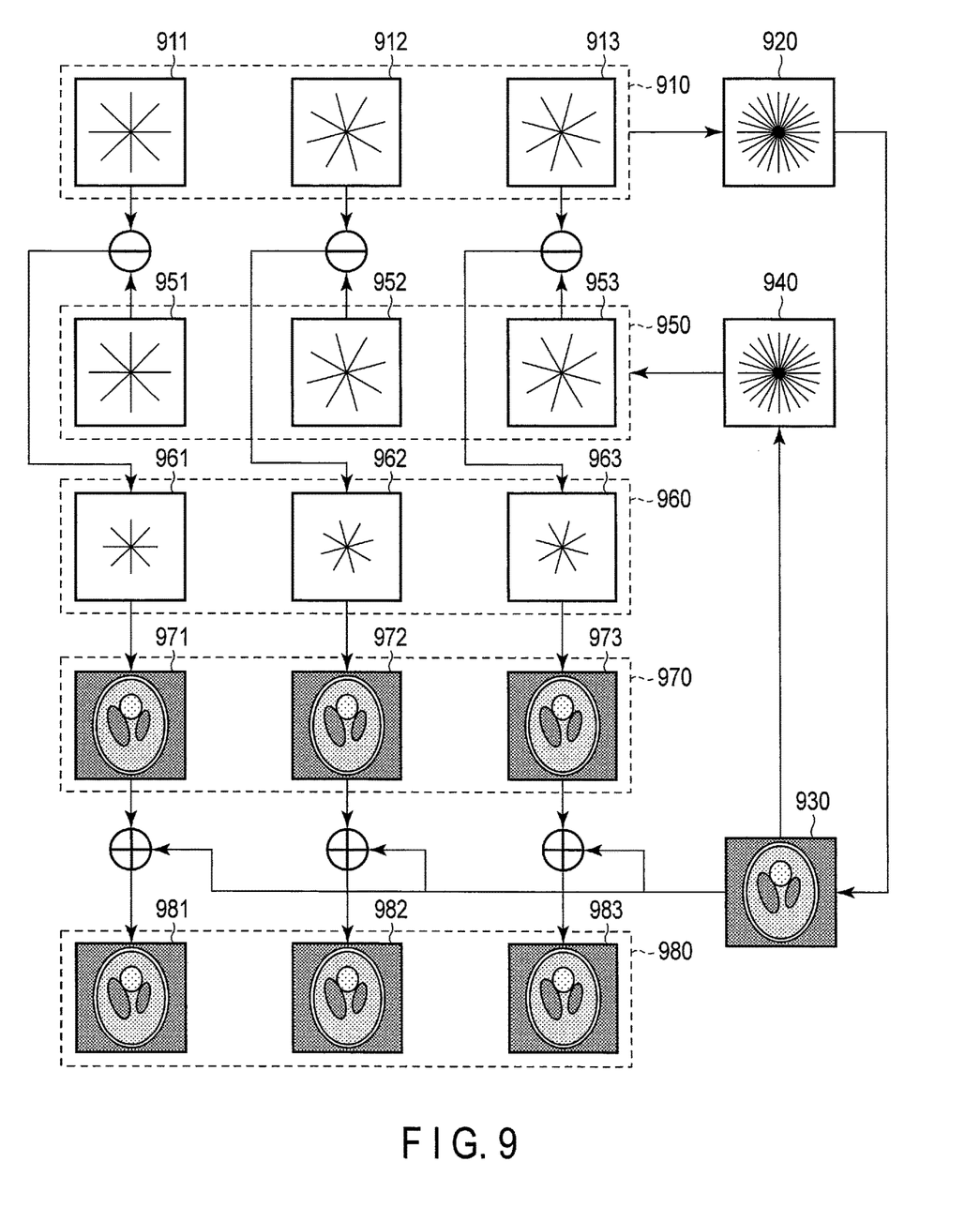
FIG. 9 is a diagram showing an example of reconstruction processing in the embodiment.

FIG. 9 is a diagram showing an example of the reconstruction processing in one embodiment. In FIG. 9, a reference image 930 is generated from k-space data 920 obtained by integrating all partial k-space data items 910; however, the embodiment is not limited to this example. When using a PI, the reconstruction processing shown in FIG. 9 is executed for each of a plurality of reception coils.

The imaging control circuitry 121 acquires the partial k-space data items 910. The partial k-space data items 910 include a first partial k-space data item 911, a second partial k-space data item 912, and a third partial k-space data item 913. The partial k-space data items 910 differ from one other in terms of data filling position in the k-space.

The processing circuitry 129 generates, using the reconstruction function 129f, a reference image 930 by applying reconstruction processing to the k-space data 920.

The processing circuitry 129 generates, using the reference k-space data generation function 129c, reference k-space data 940, by applying inverse transform of the reconstruction processing to the reference image 930.

The processing circuitry 129 generates, using the reference partial k-space data generation function 129d, a plurality of reference partial k-space data items 950 based on the filling positions and the reference k-space data so as to respectively correspond to the first partial k-space data item 911, the second partial k-space data item 912, and the third partial k-space data item 913, relating to a plurality of frames arranged in time sequence.

A filling position can be specified by, for example, acquiring a combination of spokes corresponding to any frame with reference to the correspondence table 700 shown in FIG. 7. The reference partial k-space data items 950 include a first reference partial k-space data item 951, a second reference partial k-space data item 952, and a third reference partial k-space data item 953.

The processing circuitry 129 generates, using the difference k-space data generation function 129e, a plurality of difference k-space data items 960 by taking differences between the partial k-space data items 910 and the reference partial k-space data items 950 to each of the frames.

Specifically, the processing circuitry 129 generates a first difference k-space data item 961 corresponding to the difference between the first partial k-space data item 911 and the first reference partial k-space data item 951 relating to the first frame. The processing circuitry 129 generates a second difference k-space data item 962 corresponding to the difference between the second partial k-space data item 912 and the second reference partial k-space data item 952 relating to the second frame. The processing circuitry 129 generates a third difference k-space data item 963 corresponding to the difference between the third partial k-space data item 913 and the third reference partial k-space data item 953 relating to the third frame.

The processing circuitry 129 generates, using the reconstruction function 129f, a plurality of difference images 970 by applying the reconstruction processing respectively to the difference k-space data items 960.

Specifically, the processing circuitry 129 generates a first difference image 971 by applying the reconstruction processing to the first difference k-space data item 961. The processing circuitry 129 generates a second difference image 972 by applying the reconstruction processing to the second difference k-space data item 962. The processing circuitry 129 generates a third difference image 973 by applying the reconstruction processing to the third difference k-space data item 963.

The processing circuitry 129 generates, using the composite image generation function 129g, a plurality of composite images 980 by combining the reference image 930 with each of the difference images 970.

Specifically, the processing circuitry 129 generates a first composite image 981 by combining the reference image 930 with the first difference image 971. The processing circuitry 129 generates a second composite image 982 by combining the reference image 930 with the second difference image 972. The processing circuitry 129 generates a third composite image 983 by combining the reference image 930 with the third difference image 973.

As described above, according to the embodiment, the MRI apparatus generates the reference k-space data by applying inverse transform of the reconstruction processing to the reference image, and generates a plurality of reference partial k-space data items based on the filling positions and the reference k-space data, so as to respectively correspond to a plurality of partial k-space data items relating to a plurality of frames at different filling positions in the k-space and arranged in time sequence. The processing circuitry 129 generates the difference k-space data items by taking differences between the partial k-space data items and the reference k-space data items to each of the frames, generates the difference images by applying the reconstruction processing respectively to the difference k-space data items, and generates the composite images by combining the reference image with each of the difference images. Therefore, since the MRI apparatus of the embodiment applies the reconstruction processing to difference k-space data of a smaller amount of collected data as compared to partial k-space data, it is expected to reduce the number of times of computation necessary to converge repeated computation in the reconstruction processing. Since the MRI apparatus of the embodiment combines a reference image with a difference image, it is also expected to improve the quality of an image obtained by the reconstruction repeated a smaller number times as compared to a case of directly applying the reconstruction processing to the partial k-space data.

Furthermore, according to the embodiment, the MIR apparatus generates a plurality of reference partial k-space data items by extracting k-space traces respectively corresponding to the filling positions from the reference k-space data. Thus, the MRI apparatus is configured to acquire k-space data corresponding to a filling position of a partial k-space data item.

Furthermore, according to the embodiment, the MRI apparatus generates a reference image by applying the reconstruction processing to the k-space data obtained by integrating all partial k-space data items. Thus, the MRI apparatus can acquire a reference image near to a Nyquist rate.

Furthermore, according to the embodiment, the MRI apparatus generates a reference image by applying the reconstruction processing to the k-space data obtained by integrating two or more of the partial k-space data items. Thus, the MRI apparatus can acquire a reference image before acquiring all partial k-space data items.

Furthermore, according to the embodiment, the MRI apparatus generates a reference image by applying the reconstruction processing to the k-space data collected before collecting the partial k-space data items. Thus, the MRI apparatus can acquire a reference image before generating a reference image based on the partial k-space data items.

Furthermore, according to the embodiment, the MRI apparatus generates a reference image by applying the reconstruction processing to the k-space data collected after collecting the partial k-space data items. Thus, the MRI apparatus can acquire a reference image based on different scan sequences in the same imaging area.

Furthermore, according to the embodiment, the MRI apparatus generates a reference image by applying the reconstruction processing to the k-space data collected before or after the angiographic examination. Thus, the MRI apparatus can acquire a reference image that is not influenced by a radiopaque dye in the same imaging area.

Therefore, according to the MRI apparatus 100 of the embodiment described above, the image quality of a magnetic resonance image can be improved within a restricted processing time.

In the above explanation of the embodiment, the partial k-space data items are collected chiefly by a radial scan, for example. However, the embodiment is not limited to this example. Alternatively, the partial k-space data items may be collected by a spiral scan using a plurality of interleaves. An interleave corresponds to one of the spiral collection lines in the spiral scan. When using the spiral scan, each of the partial k-space data items is k-space data collected by one interleave. Alternatively, each of the partial k-space data items may be collected by the Cartesian scan based on a collection line of filling positions generated in a pseudo-random manner.

(Modification)

As a modification of the present embodiment, when the technical idea relating to the difference reconstruction processing of the present MRI apparatus 100 is realized on a processing apparatus 131, the processing apparatus includes structural elements enclosed with the broken line in the configuration diagram of FIG. 1. In this case, the interface 123 functions as circuitry relating to the communication interface for use in connection with a network, and acquires partial k-space data items or the like. Specifically, the interface 123 acquires partial k-space data items, or the like, from the MRI apparatus via a network. In the modification, the interface 123 is an example of an acquisition unit.

In the processing apparatus 131, the processing circuitry 129 generates, using the reference k-space data generation function 129c, reference k-space data by applying inverse transform of the reconstruction processing to the reference image. The processing circuitry 129 generates, using the reference partial k-space data generation function 129d, a plurality of reference partial k-space data items based on the filling positions and the reference k-space data so as to respectively correspond to a plurality of partial k-space data items relating to a plurality of frames at different filling positions in the k-space and arranged in time sequence. The processing circuitry 129 generates, using the difference k-space data generation function 129e, a plurality of difference k-space data items by taking differences between the partial k-space data items and the reference k-space data items to each of the frames. The processing circuitry 129 generates, using the reconstruction function 129f, a plurality of difference images by applying the reconstruction processing respectively to the difference k-space data items. The processing circuitry 129 generates, using the composite image generation function 129g, a plurality of composite images by combining the reference image with each of the difference images. The difference reconstruction processing by the processing circuitry 129 of the processing apparatus 131 is the same as that in the embodiment, and explanations thereof are omitted.

According to the MRI apparatus 131 of the modification described above, the image quality of a magnetic resonance image can be improved within a restricted processing time.

The operations of the processing apparatus 131 of the embodiment and the MRI apparatus 100 of the modification can be executed as a medical image processing method. Advantages relating to the medical image processing method are the same as those in the embodiment, the modification, etc., and explanations thereof are omitted.

According to at least one embodiment described above, the image quality of a magnetic resonance image can be improved within a restricted processing time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising: processing circuitry configured to:
generate reference k-space data by applying inverse transform of reconstruction processing to a reference image;
generate a plurality of reference partial k-space data items so as to respectively correspond to a plurality of partial k-space data items relating to a plurality of frames at different filling positions in a k-space and arranged in time sequence, based on the filling positions and the reference k-space data;
generate a plurality of difference k-space data items by taking differences between the partial k-space data items and the reference k-space data items to each of the frames;
generate a plurality of difference images by applying the reconstruction processing respectively to the difference k-space data items; and
generate a plurality of composite images by combining the reference image with each of the difference images.

2. The magnetic resonance imaging apparatus according to claim 1, wherein the processing circuitry is further configured to generate the reference partial k-space data items by extracting k-space traces respectively corresponding to the filling positions from the reference k-space data.

3. The magnetic resonance imaging apparatus according to claim 1, wherein the processing circuitry is further configured to generate the reference image by applying the reconstruction processing to the k-space data obtained by integrating all of the partial k-space data items.

4. The magnetic resonance imaging apparatus according to claim 1, wherein the processing circuitry is further configured to generate the reference image by applying the reconstruction processing to the k-space data obtained by integrating two or more of the partial k-space data items.

5. The magnetic resonance imaging apparatus according to claim 1, wherein the processing circuitry is further configured to generate the reference image by applying the reconstruction processing to the k-space data collected before collection of the partial k-space data items.

6. The magnetic resonance imaging apparatus according to claim 1, wherein the processing circuitry is further configured to generate the reference image by applying the reconstruction processing to the k-space data collected after collection of the partial k-space data items.

7. The magnetic resonance imaging apparatus according to claim 1, wherein the processing circuitry is further configured to generate the reference image by applying the reconstruction processing to the k-space data collected before or after an angiographic examination.

8. The magnetic resonance imaging apparatus according to claim 1, wherein the processing circuitry is further configured to perform a radial scan and acquire the partial k-space data items.

9. The magnetic resonance imaging apparatus according to claim 1, wherein the processing circuitry is further configured to perform a spiral scan and acquire the partial k-space data items.

10. The magnetic resonance imaging apparatus according to claim 1, wherein the processing circuitry is further configured to perform a Cartesian scan and acquire the partial k-space data items.

11. The magnetic resonance imaging apparatus according to claim 1, wherein the processing circuitry is further configured to generate the difference images by applying the reconstruction processing which introduced a correlation between the frames.

12. The magnetic resonance imaging apparatus according to claim 11, wherein the correlation is compressed sensing.

13. The magnetic resonance imaging apparatus according to claim 1, wherein the processing circuitry is further configured to generate the composite images by combining the reference image with each of the difference images.

14. A processing apparatus comprising:
processing circuitry configured to:
generate reference k-space data by applying inverse transform of reconstruction processing to a reference image;
generate a plurality of reference partial k-space data items so as to respectively correspond to a plurality of partial k-space data items relating to a plurality of frames at different filling positions in a k-space and arranged in time sequence, based on the filling positions and the reference k-space data;
generate a plurality of difference k-space data items by taking differences between the partial k-space data items and the reference k-space data items to each of the frames;
generate a plurality of difference images by applying the reconstruction processing respectively to the difference k-space data items; and
generate a plurality of composite images by combining the reference image with each of the difference images.

15. A medical image processing method comprising:
generating reference k-space data by applying inverse transform of reconstruction processing to a reference image;
generating a plurality of reference partial k-space data items so as to respectively correspond to a plurality of partial k-space data items relating to a plurality of frames at different filling positions in a k-space and arranged in time sequence, based on the filling positions and the reference k-space data;
generating a plurality of difference k-space data items by taking differences between the partial k-space data items and the reference k-space data items to each of the frames;
generating a plurality of difference images by applying the reconstruction processing respectively to the difference k-space data items; and
generating a plurality of composite images by combining the reference image with each of the difference images.

* * * * *